(12) United States Patent
Fujiwara et al.

(10) Patent No.: US 10,784,393 B2
(45) Date of Patent: Sep. 22, 2020

(54) PHOTODETECTION ELEMENT HAVING A PERIODIC NANO-CONCAVE/CONVEX STRUCTURE

(71) Applicant: HAMAMATSU PHOTONICS K.K., Hamamatsu-shi, Shizuoka (JP)

(72) Inventors: Hiroyasu Fujiwara, Hamamatsu (JP); Wei Dong, Hamamatsu (JP); Kazutoshi Nakajima, Hamamatsu (JP); Shohei Hayashi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/100,457

(22) Filed: Aug. 10, 2018

(65) Prior Publication Data

US 2019/0058073 A1 Feb. 21, 2019

(30) Foreign Application Priority Data

Aug. 18, 2017 (JP) ................................ 2017-158033

(51) Int. Cl.
  *H01L 31/08* (2006.01)
  *H01L 31/02* (2006.01)
  (Continued)

(52) U.S. Cl.
  CPC ...... *H01L 31/108* (2013.01); *H01L 31/02327* (2013.01); *H01L 31/022408* (2013.01);
  (Continued)

(58) Field of Classification Search
  CPC ............. H01L 31/108; H01L 31/02327; H01L 31/03529; H01L 31/07; H01L 31/1013
  See application file for complete search history.

(56) References Cited

U.S. PATENT DOCUMENTS

| 5,527,730 A * | 6/1996 | Kayaoka | H01L 21/28537 |
| | | | 257/E21.008 |
| 7,413,819 B2 * | 8/2008 | Hattori | B82Y 10/00 |
| | | | 428/836 |

(Continued)

FOREIGN PATENT DOCUMENTS

| JP | 2659184 B2 | 9/1997 |
| JP | 2000-164918 A | 6/2000 |

(Continued)

*Primary Examiner* — Ida M Soward
(74) *Attorney, Agent, or Firm* — Faegre Drinker Biddle & Reath LLP

(57) ABSTRACT

A photodetection element is a photodetection element having an incidence surface for light on a back surface of a semiconductor layer, and includes a periodic nano-concave/convex structure provided on a front surface of the semiconductor layer and having convex portions and concave portions constituting a longitudinal resonator and a transverse resonator for the light incident from the incidence surface, the periodic nano-concave/convex structure converting the light into surface plasmons, and a metal film provided to cover the periodic nano-concave/convex structure, a height and an arrangement pitch of the convex portions in the periodic nano-concave/convex structure are set such that a resonance wavelength of the longitudinal resonator and a resonance wavelength of the transverse resonator match, and a thickness of the metal film is equal to or greater than 20 nm.

18 Claims, 11 Drawing Sheets

(51) Int. Cl.
*H01L 31/0352* (2006.01)
*H01L 31/07* (2012.01)
*H01L 31/10* (2006.01)
*H01L 31/108* (2006.01)
*H01L 31/101* (2006.01)
*H01L 31/0232* (2014.01)
*H01L 31/0224* (2006.01)

(52) U.S. Cl.
CPC ........ *H01L 31/03529* (2013.01); *H01L 31/07* (2013.01); *H01L 31/1013* (2013.01)

(56) References Cited

U.S. PATENT DOCUMENTS

| | | | | |
|---|---|---|---|---|
| 7,705,280 | B2* | 4/2010 | Nuzzo | G01N 21/554 250/208.1 |
| 7,839,508 | B2* | 11/2010 | Nishikawa | G01N 21/554 356/445 |
| 7,961,280 | B2* | 6/2011 | Fujioka | G02F 1/133371 349/114 |
| 8,427,039 | B2* | 4/2013 | Legagneux | B82Y 10/00 313/2.1 |
| 9,153,733 | B2* | 10/2015 | Yu | H01L 33/02 |
| 9,313,904 | B2* | 4/2016 | Kaneko | H05K 3/465 |
| 9,768,347 | B2* | 9/2017 | Teo | H01L 33/06 |
| 2003/0160918 | A1* | 8/2003 | Rho | G02F 1/133555 349/113 |
| 2004/0115825 | A1* | 6/2004 | Budach | B82Y 20/00 436/172 |
| 2005/0174642 | A1* | 8/2005 | Tokunaga | G02B 5/3033 359/487.05 |
| 2006/0119853 | A1* | 6/2006 | Baumberg | G01N 21/658 356/445 |
| 2006/0137737 | A1* | 6/2006 | Nakayama | H01L 31/0392 136/255 |
| 2006/0267120 | A1* | 11/2006 | Nakahori | G02F 1/133555 257/414 |
| 2007/0012876 | A1* | 1/2007 | Lee | H01L 21/02381 250/338.4 |
| 2007/0122934 | A1* | 5/2007 | Lin | H01L 31/035281 438/69 |
| 2010/0308204 | A1* | 12/2010 | Taniguchi | C23C 4/185 249/114.1 |
| 2014/0007931 | A1* | 1/2014 | Guha | H01L 31/022425 136/255 |
| 2015/0028325 | A1* | 1/2015 | Seki | G03F 7/0002 257/40 |
| 2015/0047702 | A1* | 2/2015 | Gu | H01L 31/022408 136/256 |
| 2015/0075599 | A1* | 3/2015 | Yu | H01L 31/02167 136/256 |
| 2015/0221796 | A1* | 8/2015 | Smith | H01L 31/09 257/440 |
| 2015/0228837 | A1* | 8/2015 | Chen | H01L 31/108 257/455 |
| 2015/0349192 | A1* | 12/2015 | Park | H01L 31/022483 438/92 |
| 2016/0005892 | A1* | 1/2016 | Yu | H01L 31/03529 136/255 |
| 2016/0043250 | A1* | 2/2016 | Smith | H01L 31/02366 136/255 |
| 2016/0322517 | A1* | 11/2016 | Narasimhan | H01L 31/02366 |
| 2018/0203263 | A1* | 7/2018 | Long | G02F 1/0126 |
| 2018/0301569 | A1* | 10/2018 | Jacob | H01L 31/02327 |
| 2018/0306955 | A1* | 10/2018 | Goto | G02B 5/3083 |

FOREIGN PATENT DOCUMENTS

| | | |
|---|---|---|
| JP | 2011-77274 A | 4/2011 |
| JP | 2011077274 A * | 4/2011 |
| JP | 4789752 B2 | 10/2011 |

* cited by examiner

PHOTODETECTION ELEMENT HAVING A PERIODIC NANO-CONCAVE/CONVEX STRUCTURE

TECHNICAL FIELD

The present disclosure relates to a photodetection element.

BACKGROUND

In the field of photodetection, there is an increasing demand for a technology capable of performing detection of near infrared light at low cost. The detection of near infrared light is expected to be applied to, for example, automatic driving technology for automobiles. An example of a photodetection element of the related art capable of detecting near infrared light includes a photodetection element using a compound semiconductor including an element of Group II to Group VI, but a process of fabricating a photodetection element using a compound semiconductor is complicated and expensive. Further, in a general PN junction type photodetection element, it is difficult to detect light having a wavelength longer than a band gap of silicon (equal to or greater than 1100 nm), and even in a photodetection element using black silicon, a detection limit at longer wavelengths is about 1200 nm.

On the other hand, in a Schottky type photodetection element using a Schottky junction, free electrons are excited due to light absorption inside a metal film, and the generated excited electrons (hot carriers) flow as a photocurrent to a semiconductor side beyond the Schottky barrier. Since a detection limit on the long wavelength side is determined by a height of the Schottky barrier, light with a wavelength longer than a band gap of silicon can be detected. Examples of such a Schottky type photodetection element include photodetection elements described in Japanese Patent No. 4789752, Japanese Unexamined Patent Publication No. 2000-164918, Japanese Unexamined Patent Publication No. 2011-77274, and Japanese Patent No. 2659184. Such a photodetection element of the related art is configured as a back side incidence type photodetection element in which a metal film that forms a Schottky junction with the semiconductor layer is provided on the surface of the semiconductor layer, and a back surface of the semiconductor layer is a light incidence surface. A periodic concavo-convex structure is provided on the surface of the semiconductor layer, and a surface area of the metal film with respect to incident light is extended to achieve improved sensitivity.

SUMMARY

The sensitivity (the amount of photocurrent) of a Schottky junction type photodetection element described above is expressed by a product of the number of generated hot carriers, a probability of hot carriers reaching a Schottky barrier, and a probability of hot carriers going beyond the Schottky barrier. Since the number of generated hot carriers depends on the amount of light absorption in a metal film, it is effective to improve the amount of light absorption so as to improve the sensitivity of the photodetection element.

However, in the photodetection elements of the related art described above, it is assumed that hot carriers generated in the metal film are extracted from the semiconductor layer. Therefore, for example, in Patent Document 2 above, a thickness of the metal film is equal to or smaller than a mean free path of hot carriers generated by the metal film (equal to or smaller than several nm), and it is unlikely that a sufficient amount of light absorption in the metal film will be obtained. Further, for example, when a reflective film is provided behind the metal film as in Patent Document 4, there is a risk of disconnection or high resistance.

The present disclosure has been made to solve the above-described problems, and an object of the present disclosure is to provide a photodetection element capable of detecting near infrared light with sufficient sensitivity at low cost.

The applicant focused attention on the contribution of a certain distance from an interface with a semiconductor layer in a metal film to absorption of incident light in a process of studying the photodetection element. A prototype of a photodetection element having a periodic nano-concave/convex structure that converts light into surface plasmons s was fabricated, and an actually measured value and a calculated value of the effective amount of absorption of light in the metal film with respect to the distance from the interface of the semiconductor layer were obtained. As a result, it was found that when the concavo-convex pattern constituting the periodic nano-concave/convex structure satisfies certain conditions, light absorption of the metal film is enhanced in a range within a predetermined distance from an interface with the semiconductor layer.

A photodetection element according to an aspect of the present disclosure is a photodetection element having a light incidence surface on one side of a semiconductor layer, the photodetection element including: a periodic nano-concave/convex structure provided on the other surface of the semiconductor layer and having convex portions and concave portions constituting a longitudinal resonator and a transverse resonator for the light incident from the incidence surface, the periodic nano-concave/convex structure converting the light into surface plasmons s; and a metal film provided to cover the periodic nano-concave/convex structure, wherein a height and an arrangement pitch of the convex portions in the periodic nano-concave/convex structure are set such that a resonance wavelength of the longitudinal resonator and a resonance wavelength of the transverse resonator match, and a thickness of the metal film is equal to or greater than 20 nm.

In this photodetection element, the incidence surface is provided on a back surface of the semiconductor layer, and the light incident from the incidence surface is confined by the longitudinal resonator formed in a height direction of concavo-convex portions and the transverse resonator formed in an arrangement direction of the concavo-convex portions in the periodic nano-concave/convex structure on a front surface of the semiconductor layer. Here, when the resonance wavelength of the longitudinal resonator and the resonance wavelength of the transverse resonator match, the light absorption of the metal film being enhanced in a range within 20 nm from the interface of the semiconductor layer is obtained from the above finding. Therefore, the height and the arrangement pitch of the convex portions in the periodic nano-concave/convex structure are set so that the resonance wavelength of the longitudinal resonator and the resonance wavelength of the transverse resonator match, and the thickness of the metal film is set to be equal to or greater than 20 nm, such that efficient light absorption in the metal film can be achieved, and a photodetection element capable of detecting near infrared light with sufficient sensitivity at low cost can be obtained.

Further, when the wavelength of the surface plasmons s generated in the periodic nano-concave/convex structure is $\lambda_p$, the height T of the convex portions may satisfy $\frac{3}{8}\lambda_p < T < \frac{5}{8}\lambda_p$, and the arrangement pitch P of the convex portions may satisfy $9/10\lambda_p<P<11/10\lambda_p$. Under such conditions, the light absorption of the metal film is sufficiently enhanced in a range within 20 nm from the interface of the semiconductor layer.

Further, when the wavelength of the surface plasmons generated in the periodic nano-concave/convex structure is $\lambda_p$, the width D of the concave portions may satisfy 50 nm<D<$\lambda_p$−50 nm. Under such conditions, the light absorption of the metal film is sufficiently enhanced in a range within 20 nm from the interface of the semiconductor layer.

Further, the semiconductor layer may be formed of silicon. Accordingly, the photodetection element can be fabricated at yet lower cost.

Further, the metal film may include aluminum. In this case, a process of fabricating the metal film is facilitated.

Further, the metal film may be formed of a plurality of films including a first film in contact with the semiconductor layer and a second film with a refractive index smaller than that of the first film element. In this case, light can be confined in the vicinity of the interface with the semiconductor layer in the metal film, and the amount of light absorption can be further improved.

Further, the concave portions in the periodic nano-concave/convex structure may have an arrangement pattern in a matrix form in a plan view. When an arrangement pattern in a matrix form is adopted, light in all polarization directions is uniformly converted to surface plasmons s. Therefore, it is possible to detect light independently of the polarization direction.

Also, a transverse sectional shape of the concave portions may be a circular or rectangular shape. When a circular shape is adopted as the transverse sectional shape of the concave portions, an area in which light is affected by the periodicity of the periodic nano-concave/convex structure is reduced, and therefore, the light is converted into surface plasmons in a wider wavelength range. Therefore, it is possible to detect light over a wider wavelength range. When a rectangular shape is adopted as the transverse sectional shape of the concave portions, an area in which light is affected by the periodicity of the periodic nano-concave/convex structure is increased, and therefore, the light is converted into strong surface plasmons at a specific wavelength. Therefore, it is possible to detect light with high sensitivity at the specific wavelength.

Further, the concave portions in the periodic nano-concave/convex structure may have a stripe-shaped arrangement pattern in a plan view. When a stripe-shaped arrangement pattern is adopted, only light of which an electric field vector is orthogonal to the stripe-shaped arrangement pattern is converted into strong surface plasmons in the periodic nano-concave/convex structure. Therefore, it is possible to detect light with high sensitivity in one polarization direction.

Further, the concave portions in the periodic nano-concave/convex structure may have a concentric circular arrangement pattern in a plan view. When a concentric circular arrangement pattern is adopted, light in all polarization directions is uniformly converted to surface plasmons. Therefore, it is possible to detect light independently of the polarization direction.

Further, the concave portions in the periodic nano-concave/convex structure may have a concentric polygonal arrangement pattern in a plan view. When a concentric polygonal arrangement pattern is adopted, only light of which an electric field vector is orthogonal to each side of the concentric polygonal arrangement pattern is converted into strong surface plasmons in the periodic nano-concave/convex structure. Therefore, it is possible to detect light with high sensitivity in two polarization directions.

As described above, according to the photodetection element according to the aspect of the present disclosure, it is possible to detect near infrared light with sufficient sensitivity at low cost.

DETAILED DESCRIPTION

Hereinafter, preferred embodiments of a photodetection element according to an aspect of the present disclosure will be described in detail with reference to the drawings.

Figure 1:
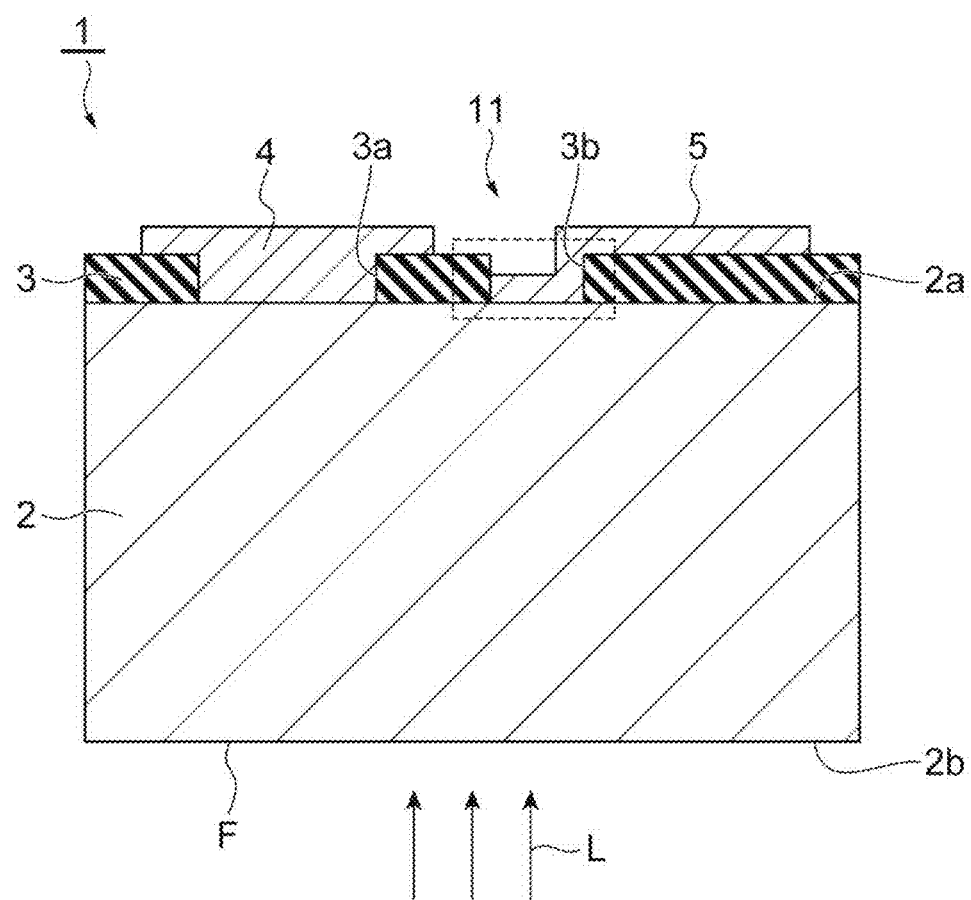
FIG. 1 is a cross-sectional view illustrating an embodiment of a photodetection element.

FIG. 1 is a cross-sectional view illustrating an embodiment of a photodetection element. This photodetection element 1 is configured as a Schottky junction type photodetection element to be used for detection of near infrared light having a wavelength equal to or greater than, for example, 1200 nm. As illustrated in FIG. 1, the photodetection element 1 includes a semiconductor layer 2, an insulating film 3, an ohmic electrode 4, and a Schottky electrode 5.

The semiconductor layer 2 is a semiconductor layer formed of, for example, silicon (Si), titanium oxide ($TiO_2$), germanium (Ge), gallium phosphide (GaP), or the like. In this embodiment, the semiconductor layer 2 formed of n-type or p-type silicon for realizing a more inexpensive fabricating process is illustrated. The photodetection element 1 is a back side incidence type photodetection element, and a back surface (one surface) 2b of the semiconductor layer 2 is an incidence surface F for light L detected by the photodetection element 1.

The insulating film 3 is formed on a surface (the other surface) 2a of the semiconductor layer 2 using, for example, silicon dioxide ($SiO_2$). A thickness of the insulating film 3 is about 100 nm, for example. In the insulating film 3, an opening 3a for realizing an ohmic junction between the ohmic electrode 4 and the semiconductor layer 2 and an opening 3b for realizing a Schottky junction between the Schottky electrode 5 and the semiconductor layer 2 are formed. The insulating film 3 is formed using, for example, a chemical vapor deposition method. For formation of the openings 3a and 3b, for example, photolithography is used.

The ohmic electrode 4 is formed of materials including, for example, gold (Au), germanium (Ge), indium (In), nickel (Ni) or platinum (Pt). The ohmic electrode 4 is provided to cover the opening 3a of the insulating film 3 on a front surface 2a of the semiconductor layer 2 and has an ohmic junction with the semiconductor layer 2 on a bottom surface of the opening 3a. The Schottky electrode 5 is formed of materials including, for example, gold (Au), silver (Ag), titanium (Ti), aluminum (Al), copper (Cu), and platinum (Pt). The Schottky electrode 5 is provided to cover the opening 3b of the insulating film 3 on a surface of the semiconductor layer 2 and has a Schottky junction with the semiconductor layer 2 on the bottom surface of the opening 3b. The ohmic electrode 4 and the Schottky electrode 5 are formed, for example, using a vacuum evaporation method. When a conductivity type of the semiconductor layer 2 is n type, a bias voltage is applied so that a potential of the Schottky electrode 5 is lower than a potential of the ohmic electrode 4 at the time of an operation of the photodetection element 1. When the conductivity type of the semiconductor layer 2 is p type, a bias voltage is applied so that the potential of the Schottky electrode 5 is higher than the potential of the ohmic electrode 4 at the time of an operation of the photodetection element 1. In either case, the bias voltage may be zero.

Figure 2:
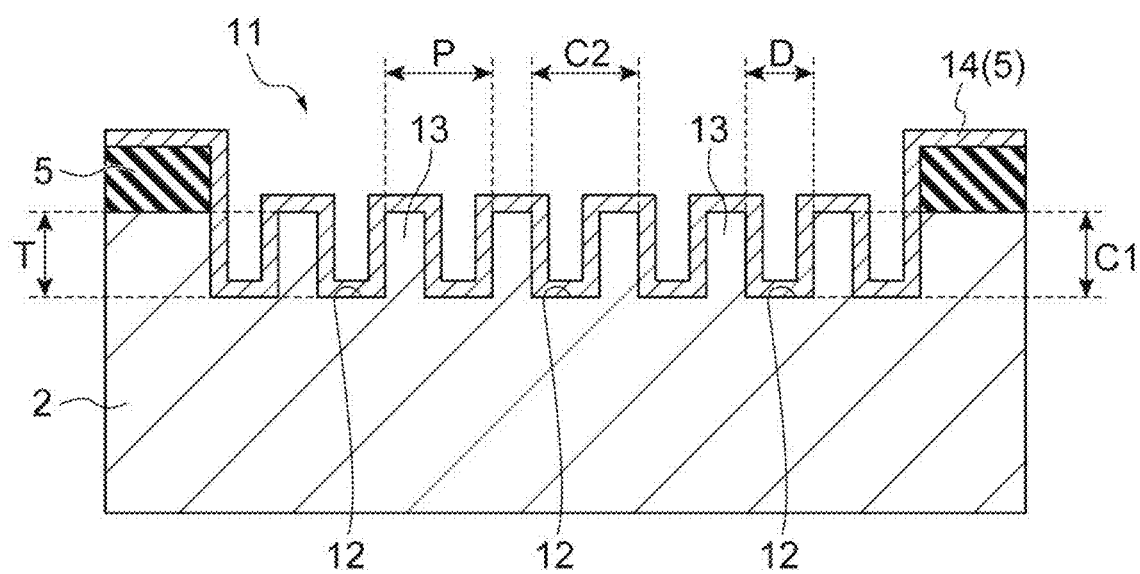
FIG. 2 is an enlarged cross-sectional view of main parts illustrating a configuration in the vicinity of a periodic nano-concave/convex structure in the photodetection element illustrated in FIG. 1.
Figure 3:
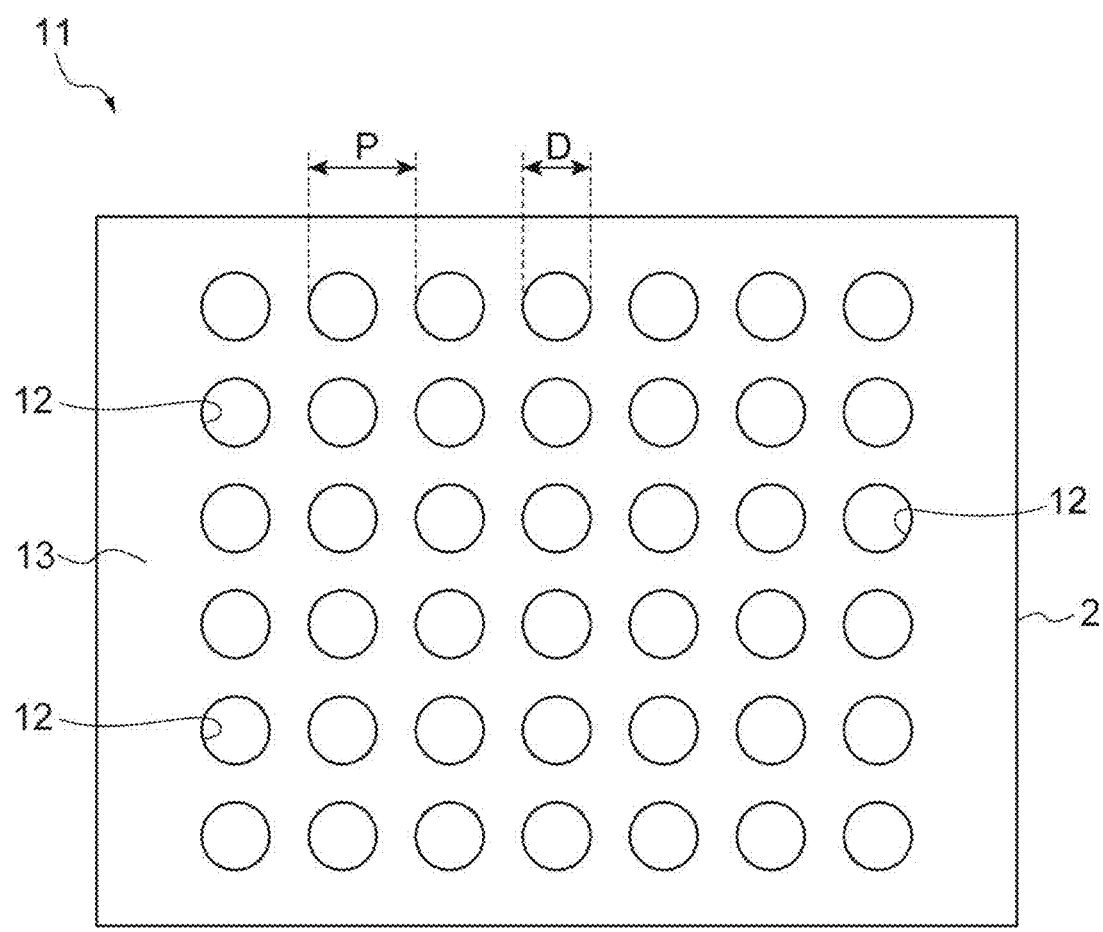
FIG. 3 is a plan view illustrating an arrangement pattern of concave portions in the periodic nano-concave/convex structure.

Further, a periodic nano-concave/convex structure 11 that converts the light L incident from the incidence surface F into surface plasmons is provided at a position corresponding to the opening 3b of the insulating film 3 in the front surface 2a of the semiconductor layer 2. FIG. 2 is an enlarged cross-sectional view of main parts illustrating a configuration of the vicinity (a broken line portion in FIG. 1) of a periodic nano-concave/convex structure. Further, FIG. 3 is a plan view illustrating an arrangement pattern of a concave portion in the periodic nano-concave/convex structure. As illustrated in FIGS. 2 and 3, the periodic nano-concave/convex structure 11 includes, for example, concave portions 12 and convex portions 13 formed in a nano order in an area equal to or greater than a spot size of the light L incident from the incidence surface F. The concavo-convex pattern formed of the concave portions 12 and the convex portions 13 is formed using, for example, an electron beam exposure method, a method in which lithography based on nanoimprinting and reactive ion etching or lift-off are combined, or a direct processing method using a focused ion beam.

In the embodiment, as illustrated in FIG. 3, the concave portions 12 constituting the periodic nano-concave/convex structure 11 have an arrangement pattern in a matrix form in a plan view. In the example of FIG. 3, an arrangement pitch in a row direction and an arrangement pitch in a column direction of the concave portions 12 are coincident with each other. Further, the concave portion 12 has a cylindrical shape, a transverse sectional shape of the concave portion 12 is a circular shape, and a longitudinal sectional shape of the concave portion 12 is a rectangular shape (see FIG. 2). With such an arrangement pattern, the periodic nano-concave/convex structure 11 constitutes a longitudinal resonator C1 and a transverse resonator C2 with respect to the light L incident from the incidence surface F, as illustrated in FIG. 2. The longitudinal resonator C1 is a resonator formed in a height direction of concavo-convex portions, and is constituted by a bottom surface of the convex portions 13 and a top surface of the convex portions 13. Further, the transverse resonator C2 is a resonator formed in the arrangement direction of the concavo-convex portions, and is constituted between the same positions on an inner wall surface of one concave portion 12 and an inner wall surface of an adjacent concave portion 12.

As illustrated in FIG. 2, the metal film 14 constituting the Schottky electrode 5 is formed so as to cover the periodic nano-concave/convex structure 11. That is, the metal film 14 is provided to cover the top surface of the convex portions 13, the bottom surface of the concave portions 12, and the inner wall surface of the concave portions 12 in the periodic nano-concave/convex structure 11. When the semiconductor layer 2 is formed of silicon as in this embodiment, it is preferable for the metal film 14 be a single layer film of aluminum (Al) in consideration of ease of fabrication using a silicon process.

Further, the metal film 14 may be a multilayer film. In this case, the metal film 14 may be formed as a film of a plurality of layers including a first film in contact with the semiconductor layer 2 and a second film with a refractive index smaller than that of the first film. Examples of a combination of materials of the first film and the second film may include titanium (Ti)/gold (Au), titanium (Ti)/silver (Ag), aluminum (Al)/gold (Au), titanium (Ti)/aluminum (Al).

In the periodic nano-concave/convex structure 11, the semiconductor layer 2 and the metal film 14 have a Schottky junction. In the vicinity of a Schottky junction surface in the semiconductor layer 2, a depletion layer is formed with the Schottky junction with the metal film 14. The light L incident from the incidence surface F is confined in the longitudinal resonator C1 and the transverse resonator C2 and is converted into propagating surface plasmons s propagating on the surface of the metal film 14. Due to vibration of the light L resonating with the surface plasmons, the energy of the light L is absorbed by the metal film 14. Free electrons are excited by light absorption inside the metal film 14, and generated hot carriers flow as a photocurrent to the semiconductor layer 2 beyond the Schottky barrier.

In the embodiment, a thickness of the metal film 14 is equal to or greater than 20 nm in order to improve efficiency of light absorption in the metal film 14. Further, the height T of the convex portions 13 (=a depth of the concave portion 12), the arrangement pitch P of the convex portions 13, and the width D of the concave portion in the periodic nano-concave/convex structure 11 are set such that the resonance wavelength of the longitudinal resonator C1 and the resonance wavelength of the transverse resonator C2 match. More specifically, when the wavelength of the surface plasmons generated in the periodic nano-concave/convex structure 11 is $\lambda_p$, the height T of the convex portion 13 satisfies $3/8\lambda_p < T < 5/8\lambda_p$, and the arrangement pitch P of the convex portions 13 satisfies $9/10\lambda_p < P < 11/10\lambda_p$. Further, the width D of the concave portion 12 (here, a diameter of the concave portion 12) satisfies 50 nm $< D < \lambda_p - 50$ nm. Hereinafter, this configuration will be described in detail.

The sensitivity (the amount of photocurrent) of the Schottky junction type photodetection element is expressed by a product of the number of generated hot carriers, a probability of the hot carriers reaching the Schottky barrier, and a probability of the hot carriers going beyond the Schottky barrier. Since the number of generated hot carriers depends on the amount of light absorption in the metal film, it is effective to improve the amount of light absorption in the metal film so as to improve the sensitivity of the photodetection element.

A transport probability (a probability of moving a distance r) from a generation position of excited electrons is expressed by exp(−r/L). L is a mean free path inside the metal film and is approximately 30 nm. When a shortest distance from the generation position of the excited electrons to an interface of the semiconductor layer is z, the distance z is a distance of a perpendicular line connecting the generation position of the excited electrons to the interface of the semiconductor layer. Therefore, when an angle formed by a traveling direction of the excited electrons and the perpendicular line is θ, the transport probability of the excited electrons is exp(−r/L cos θ). An integrated value (hereinafter, the integrated value is referred to as "effective amount of absorption") obtained by multiplying the amount of light absorption at a position at which excited electrons are generated inside the electrode film by the transport probability and performing volume integration over the entire inside of the electrode film is a value proportional to a sensitivity of the Schottky junction type photodetection element.

A sample of a photodetection element having a periodic slit structure as a Schottky electrode was prepared so as to evaluate the amount of light absorption in the metal film using the effective amount of absorption. In this photodetection element for evaluation, a Schottky electrode with a thickness of 370 nm was formed on a semiconductor layer formed of silicon (Si), and slits were formed with a width of 100 nm at a period of 850 nm in the Schottky electrode by a focused ion beam device. The slits were through slits and were formed so that a surface of the semiconductor layer was exposed.

Samples of two types including a sample in which a metal film constituting the Schottky electrode was formed as a single layer of gold (Au) and a sample in which the metal film was formed as two layers of titanium (Ti)/gold (Au) from a semiconductor layer side were prepared. In the latter, a thickness of the titanium (Ti) layer was 2 nm. For the two types of samples, a sensitivity ratio was obtained experimentally and found to be about 0.54. A difference in sensitivity between the two samples was considered to be due to the fact that a spatial distribution of light and a spatial distribution of light absorption inside the metal film are different due to the differences in an electrode constitution film and differences in the effective amount of absorption occurring. It was therefore concluded that the ratio of sensitivity between the two samples is equivalent to the ratio of the effective absorption between the two samples.

Figure 4:
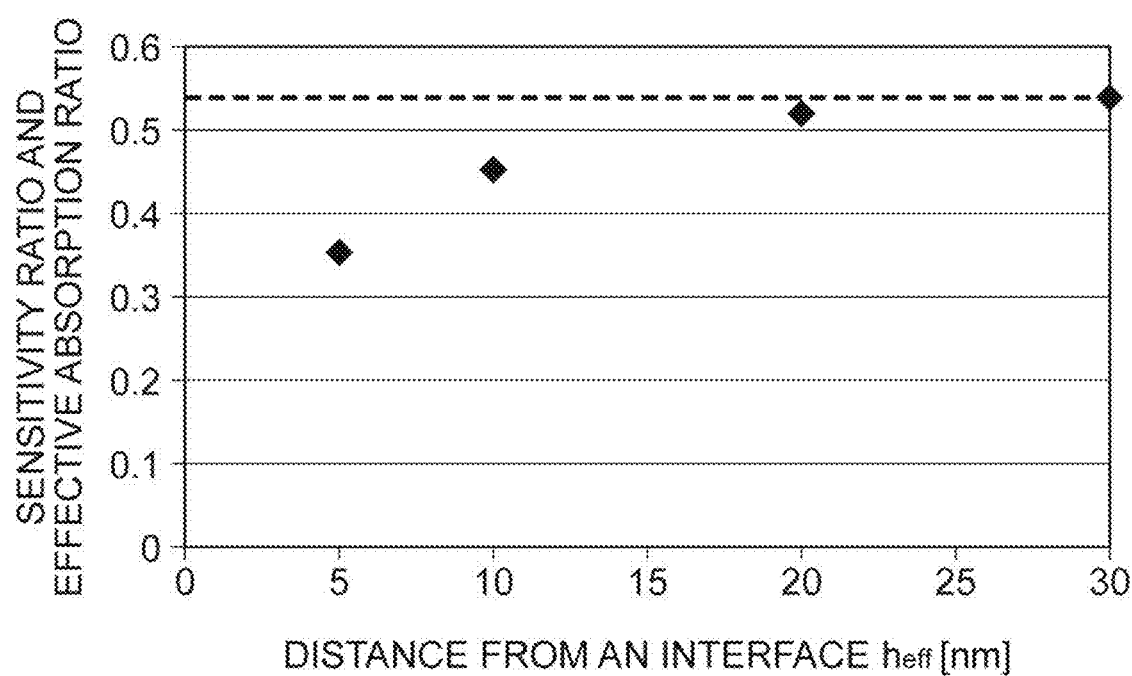
FIG. 4 is a diagram illustrating a relationship between a distance from an interface of a semiconductor layer and ratios of sensitivity and an effective amount of absorption.

FIG. 4 is a diagram illustrating a relationship between the distance from the interface of the semiconductor layer and ratios of sensitivity and an effective amount of absorption. In FIG. 4, a horizontal axis indicates a distance $h_{eff}$ from the interface of the semiconductor layer, and a vertical axis indicates the sensitivity ratio and the ratio of the effective amount of absorption. A plot in FIG. 4 was obtained through simulation of a ratio of the effective amount of absorption from the interface of the semiconductor layer to the distance $h_{eff}$ for the two types of samples. From these results, it can be seen that as the distance $h_{eff}$ increases, the ratio of the effective amount of absorption increases, and the ratio of the effective amount of absorption becomes constant when the distance $h_{eff}$ becomes equal to or greater than 20 nm. Further, the ratio of the effective amount of absorption when the distance $h_{eff}$ is equal to or greater than 20 nm is approximately 0.54, which is substantially equal to the sensitivity ratio (a value indicated by a dotted line in FIG. 4) obtained by experiments.

From this result, it can be seen that when the thickness of the metal film does not reach 20 nm, the effective amount of absorption is insufficient and sufficient sensitivity for the photodetection element cannot be obtained. Further, when the thickness of the metal film is equal to or greater than 20 nm, it can be seen that the effective amount of absorption is maximized and the sensitivity of the photodetection element can be improved. This means that it is effective to increase the effective amount of absorption of the metal film in the range between the interface of the semiconductor layer and 20 nm so as to improve the sensitivity of the Schottky junction type photodetection element.

Figure 5:
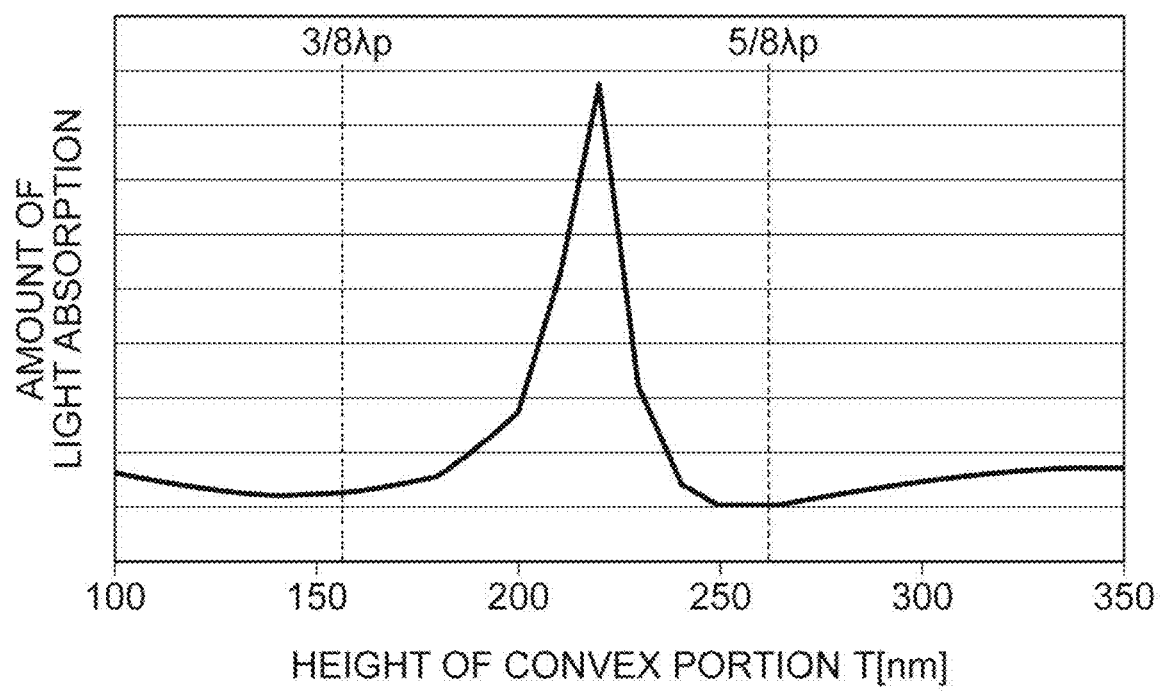
FIG. 5 is a diagram illustrating a relationship between a height of a convex portion in the periodic nano-concave/convex structure and the amount of light absorption in the metal film.

Further, the amount of light absorption inside the metal film in the range between the interface of the semiconductor layer and 20 nm is increased when the resonance wavelength of the longitudinal resonator and the resonance wavelength of the transverse resonator in the periodic nano-concave/convex structure match. FIG. 5 is a diagram illustrating a relationship between a height of the convex portion in the periodic nano-concave/convex structure and the amount of light absorption in the metal film. Further, FIG. 6 is a diagram illustrating a relationship between the arrangement pitch of the convex portions in the periodic nano-concave/convex structure and the amount of light absorption in the metal film.

FIG. 5 illustrates a simulation result in a case in which the semiconductor layer was silicon (Si), the metal film was gold (Au), and the wavelength of incident light in a vacuum was 1550 nm, and a horizontal axis indicates the height of the convex portion, and a vertical axis indicates the amount of light absorption. The amount of light absorption on the vertical axis is an integrated value of the amount of light absorption in the metal film in a range in which the distance from the interface of the semiconductor layer is between 0 nm and 20 nm. A wavelength $\lambda_p$ of the surface plasmons generated in the periodic nano-concave/convex structure is obtained as $\lambda_p = \lambda_0 \times ((\varepsilon_m + \varepsilon_d)/(\varepsilon_m \times \varepsilon_d))^{1/2}$, where a real part of the dielectric constant of the semiconductor layer is $\varepsilon_d$, a real part of the dielectric constant of the main constituent material of the metal film within a range between the interface of the semiconductor layer and 20 nm is $\varepsilon_m$, and the wavelength of the incident light in the vacuum is $\lambda_0$. Under the above conditions, is estimated to be about 422 nm.

From the result illustrated in FIG. 5, it can be seen that when the height T of the convex portion satisfies $3/8\lambda_p < t < 5/8\lambda_p$, the amount of light absorption in the metal film increases. The resonance wavelength of the longitudinal resonator is about half of the wavelength $\lambda_p$ of the surface plasmons, and the amount of light absorption has a peak when the height T of the convex portion is close to $1/2\lambda_p$. Therefore, it is particularly preferable that $T=1/2\lambda_p$ be satisfied. Further, from the results illustrated in FIG. 6, it can be seen that when the arrangement pitch P of the convex portions satisfies $9/10\lambda_p < P < 11/10\lambda_p$, the amount of light absorption in the metal film increases. The resonance wavelength of the transverse resonator is substantially equal to the wavelength $\lambda_p$ of the surface plasmons, and the amount of light absorption has a peak when the arrangement pitch P of the convex portions is close to $\lambda_p$. Therefore, it is particularly preferable that $T=\lambda_p$ be satisfied.

Figure 6:
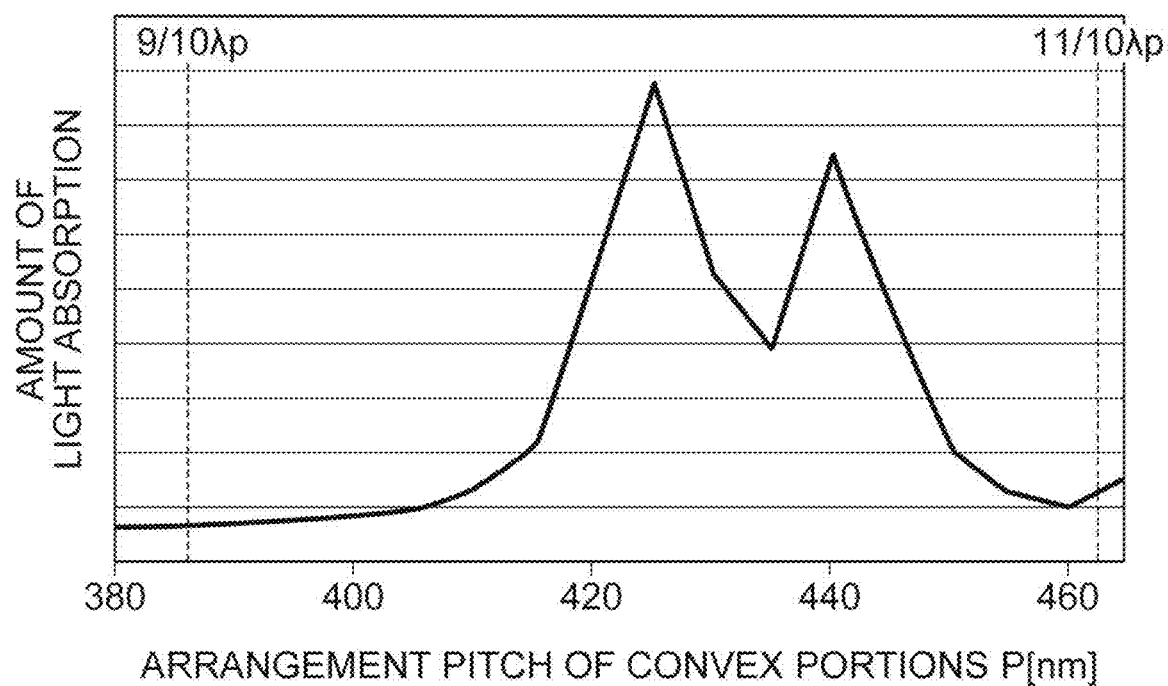
FIG. 6 is a diagram illustrating a relationship between an arrangement pitch of the convex portions in the periodic nano-concave/convex structure and the amount of light absorption in the metal film.
Figure 7:
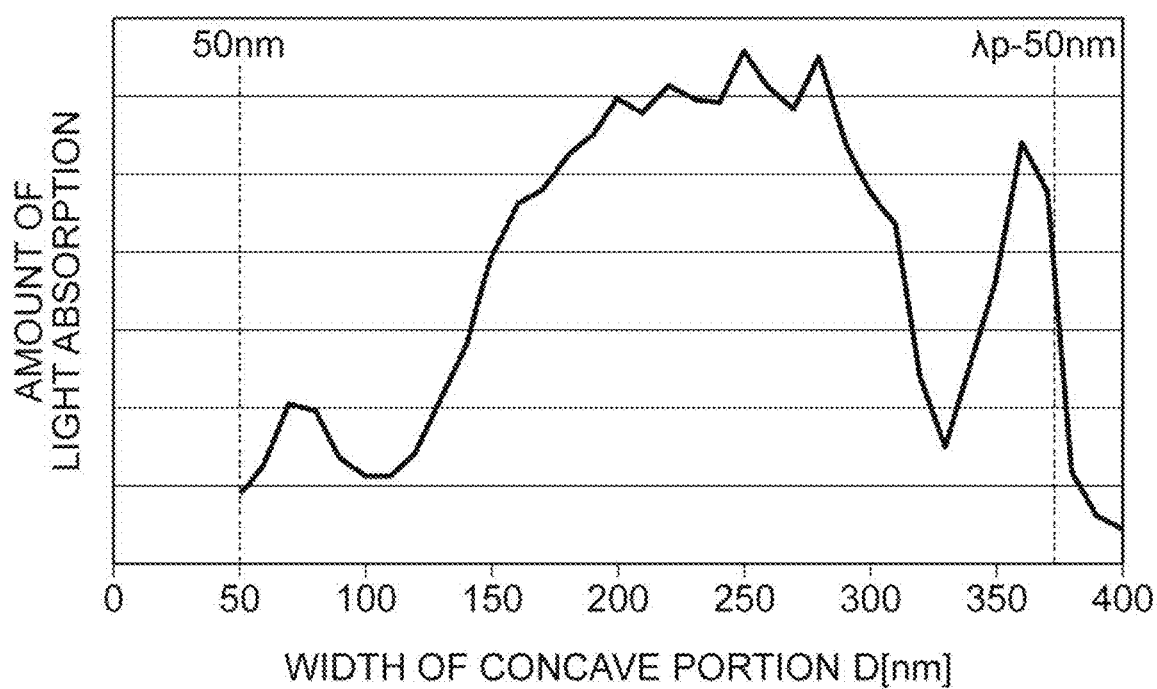
FIG. 7 is a diagram illustrating a relationship between a width of a concave portion in the periodic nano-concave/convex structure and the amount of light absorption in the metal film.

FIG. 7 is a diagram illustrating a relationship between a width of the concave portion in the periodic nano-concave/convex structure and the amount of light absorption in the metal film FIG. 7 illustrates simulation results under the same conditions as in FIGS. 5 and 6, and a horizontal axis indicates the width of the concave portion, and a vertical axis indicates the amount of light absorption. From the results illustrated in FIG. 7, it can be seen that the amount of light absorption increases in a relatively wide range with respect to a width D of the concave portion, as compared with the height T of the convex portion and the arrangement pitch P of the convex portions. However, it is difficult to form concave portions smaller than 50 nm due to restrictions in current semiconductor processing technology. Therefore, the range of the width D of the concave portion is 50 nm<D<$\lambda_p$−50 nm.

As described above, in the photodetection element 1, the incidence surface F is provided on a back surface 2b of the semiconductor layer 2, and the light L incident from the incidence surface F is confined by the longitudinal resonator C1 formed in a height direction of the concavo-convex portions and the transverse resonator C2 formed in an arrangement direction of the concavo-convex portions in the periodic nano-concave/convex structure 11 on the front surface 2a of the semiconductor layer 2. When the resonance wavelength of the longitudinal resonator C1 and the resonance wavelength of the transverse resonator C2 match, due to the above findings, the light absorption of the metal film 14 being enhanced in a range within 20 nm from the interface of the semiconductor layer 2 is achieved. Therefore, the height T and the arrangement pitch P of the convex portions 13 in the periodic nano-concave/convex structure 11 are set so that the resonance wavelength of the longitudinal resonator C1 and the resonance wavelength of the transverse resonator C2 match, and the thickness of the metal film 14 is set to be equal to or greater than 20 nm, such that efficient light absorption in the metal film 14 can be achieved, and the photodetection element 1 capable of detecting near infrared light with sufficient sensitivity at low cost can be obtained.

In the embodiment, when the wavelength of the surface plasmons generated in the periodic nano-concave/convex structure 11 is $\lambda_p$, the height T of the convex portion 13 satisfies $3/8\lambda_p < T < 5/8\lambda_p$, and the arrangement pitch P of the convex portions 13 satisfies $9/10\lambda_p < P < 11/10\lambda_p$. By satisfying such conditions, light absorption of the metal film 14 is sufficiently enhanced in a range within 20 nm from the interface of the semiconductor layer 2. Further, in the embodiment, when the wavelength of the surface plasmons generated in the periodic nano-concave/convex structure 11 is $\lambda_p$, the width D of the concave portion 12 may satisfy 50 nm<D<$\lambda_p$−50 mm. Under such conditions, light absorption of the metal film 14 is sufficiently enhanced in the range within 20 nm from the interface of the semiconductor layer 2.

Figure 8:
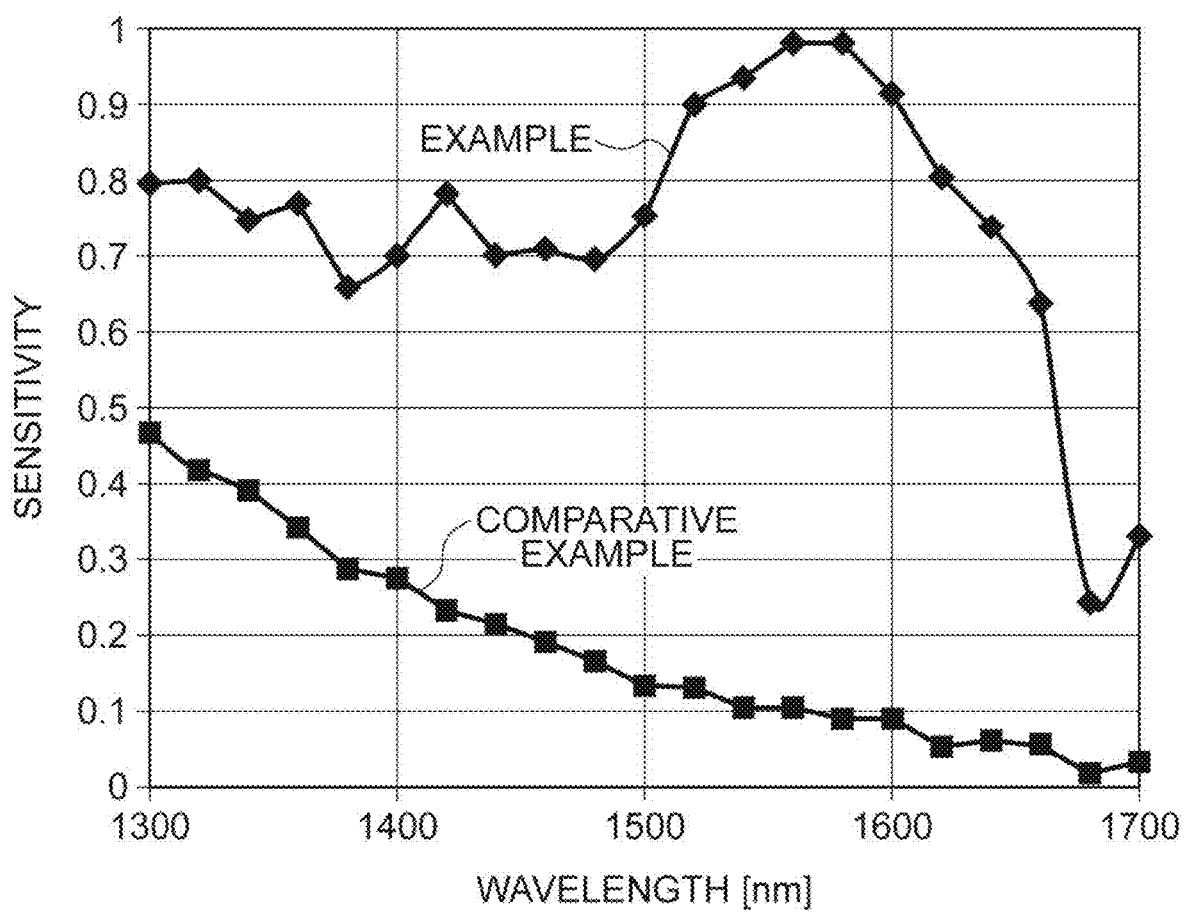
FIG. 8 is a diagram illustrating the sensitivity of the photodetection element according to the embodiment and the sensitivity of a photodetection element according to a comparative example.

FIG. 8 is a diagram illustrating the sensitivity of the photodetection element according to the embodiment and the sensitivity of a photodetection element according to a comparative example. In FIG. 8, a horizontal axis indicates a wavelength and a vertical axis indicates the sensitivity. A wavelength range on the horizontal axis is 1300 nm to 1700 nm, and the sensitivity on the vertical axis is normalized. As illustrated in FIG. 8, in the comparative example in which the periodic nano-concave/convex structure 11 is not included, the sensitivity to light with the wavelength of about 1300 nm is about 0.5, and the sensitivity decreases toward the longer wavelength side. On the other hand, in the example in which the periodic nano-concave/convex structure 11 is included, the sensitivity is equal to or greater than 0.6 in a wide range between a wavelength of 1300 nm and a wavelength of about 1700 nm, and particularly, high sensitivity equal to or greater than 0.8 is realized in a wavelength range between 1500 nm and 1600 nm.

Further, in the embodiment, the semiconductor layer 2 is formed of silicon. Accordingly, an inexpensive fabricating process can be realized, and the photodetection element 1 can be fabricated at low cost. When the metal film 14 includes aluminum, ease of fabrication of the metal film 14 through a silicon process can be ensured. Further, when the metal film 14 is formed of a plurality of films including a first film in contact with the semiconductor layer 2 and a second film having a refractive index smaller than that of the first film, light can be confined in the vicinity of the interface with the semiconductor layer 2 in the metal film 14, and the amount of light absorption can be further improved.

Further, in the embodiment, the concave portion 12 in the periodic nano-concave/convex structure 11 has an arrangement pattern in a matrix form in a plan view, and a transverse sectional shape of the concave portion 12 is a circular shape (see FIG. 3). When the circular shape is adopted as the transverse sectional shape of the concave portion 12, an area in which the light L is affected by the periodicity of the periodic nano-concave/convex structure 11 is reduced, and therefore, the light is converted into surface plasmons in a wider wavelength range. Therefore, it is possible to detect light over a wider wavelength range.

The present disclosure is not limited to the above embodiment. For example, although the ohmic electrode 4 and the Schottky electrode 5 are provided on the front surface 2a of the semiconductor layer 2 in the above embodiment, the ohmic electrode 4 may be provided on the back surface 2b of the semiconductor layer 2. In this case, an opening may be provided in the ohmic electrode 4 in correspondence to the incidence surface F, and the ohmic electrode 4 may be formed of a material having transparency to the light L. Examples of an electrode material having transparency include indium tin oxide.

Further, although the ohmic electrode 4 and the Schottky electrode 5 are exposed on the front surface 2a of the semiconductor layer 2 in the above embodiment, an insulating protective film may be formed on the surfaces of the ohmic electrode 4 and the Schottky electrode 5. In this case, technical effects such as protection of the periodic nano-concave/convex structure 11 at the time of element assembly and prevention of short-circuiting of the ohmic electrode 4 are obtained. Furthermore, an antireflection film may be provided on the incidence surface F. Accordingly, the efficiency of incidence of the light L can be improved.

Further, the semiconductor layer 2 can be thinned such that a detection region can be extended to a range between near infrared light and visible light. With the thinning of the semiconductor layer 2, improvement of a response speed due to miniaturization of the photodetection element 1 and improvement of spatial resolution due to a shortened diffusion distance of the light L incident from the incidence surface F in the element can also be achieved. The semiconductor layer 2 may be thinned over the entire back surface 2b of the semiconductor layer 2 or may be thinned only in a region corresponding to the periodic nano-concave/convex structure 11. In the former case, a configuration in which a glass substrate is provided on the back surface 2b of the semiconductor layer 2 may be adopted.

As a further application structure, in the periodic nano-concave/convex structure 11, the arrangement pitch in the row direction and the arrangement pitch in the column direction of the concave portions 12 arranged in a matrix form may be different from each other. In this case, detection of light at two wavelengths having different polarization directions can be performed. Further, a plurality of periodic nano-concave/convex structures 11 may be provided on the front surface 2a of the semiconductor layer 2, and the photodetection element 1 may be formed as an array. In this case, it is possible to perform detection of a plurality of wavelengths by changing the arrangement pitch of the concave portions 12 for each of the periodic nano-concave/convex structures 11 and to cause the photodetection element 1 to function as a spectroscopic sensor.

Further, in the embodiment, the concave portions 12 of which the transverse sectional shape is a circular shape in the periodic nano-concave/convex structure 11 may be arranged in a matrix form, but the arrangement pattern of the periodic nano-concave/convex structure 11 is not limited thereto. For example, the concave portions 12 may have a staggered arrangement pattern. Further, for example, the transverse sectional shape of the concave portion 12 may be another shape such as a rectangular shape or a triangular shape. A longitudinal sectional shape of the concave portion 12 is not limited to a quadrangular shape and may be another shape such as a trapezoidal shape or a triangular shape. A bottom surface of the concave portions 12 is not limited to a flat surface and may be concavely curved or spherical. When a rectangular shape is adopted as the transverse sectional shape of the concave portion 12, the area in which the light L senses the periodicity of the periodic nano-concave/convex structure 11 is widened, and therefore, the light L is converted into strong surface plasmons at a specific wavelength. Therefore, it is possible to detect light with high sensitivity at the specific wavelength.

Figure 9:
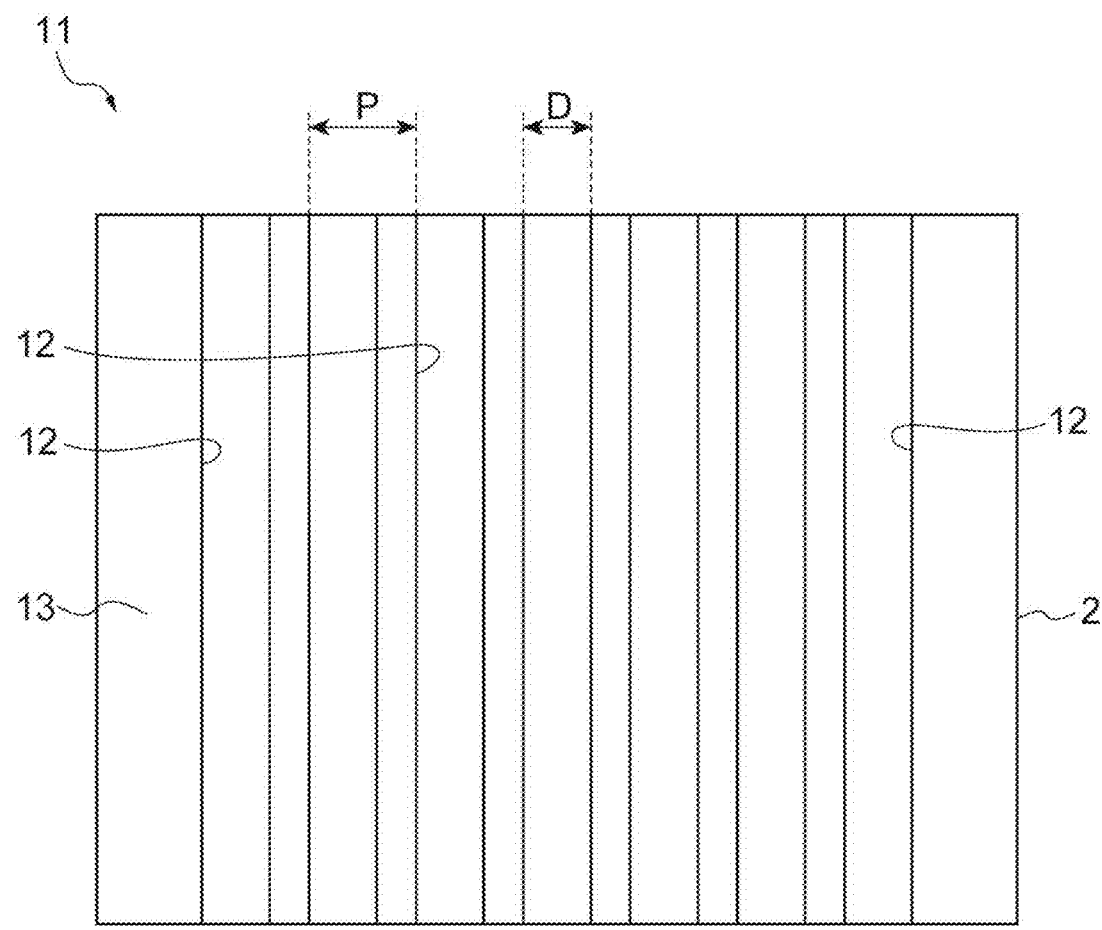
FIG. 9 is a plan view illustrating a modification example of the arrangement pattern of the concave portions in the periodic nano-concave/convex structure.

Further, as illustrated in FIG. 9, the concave portions 12 in the periodic nano-concave/convex structure 11 may have a stripe-shaped arrangement pattern in a plan view. When a stripe-shaped arrangement pattern is adopted, only the light L of which an electric field vector is orthogonal to the stripe-shaped arrangement pattern is converted into strong surface plasmons in the periodic nano-concave/convex structure 11. Therefore, it is possible to detect light with high sensitivity in one polarization direction.

Figure 10:
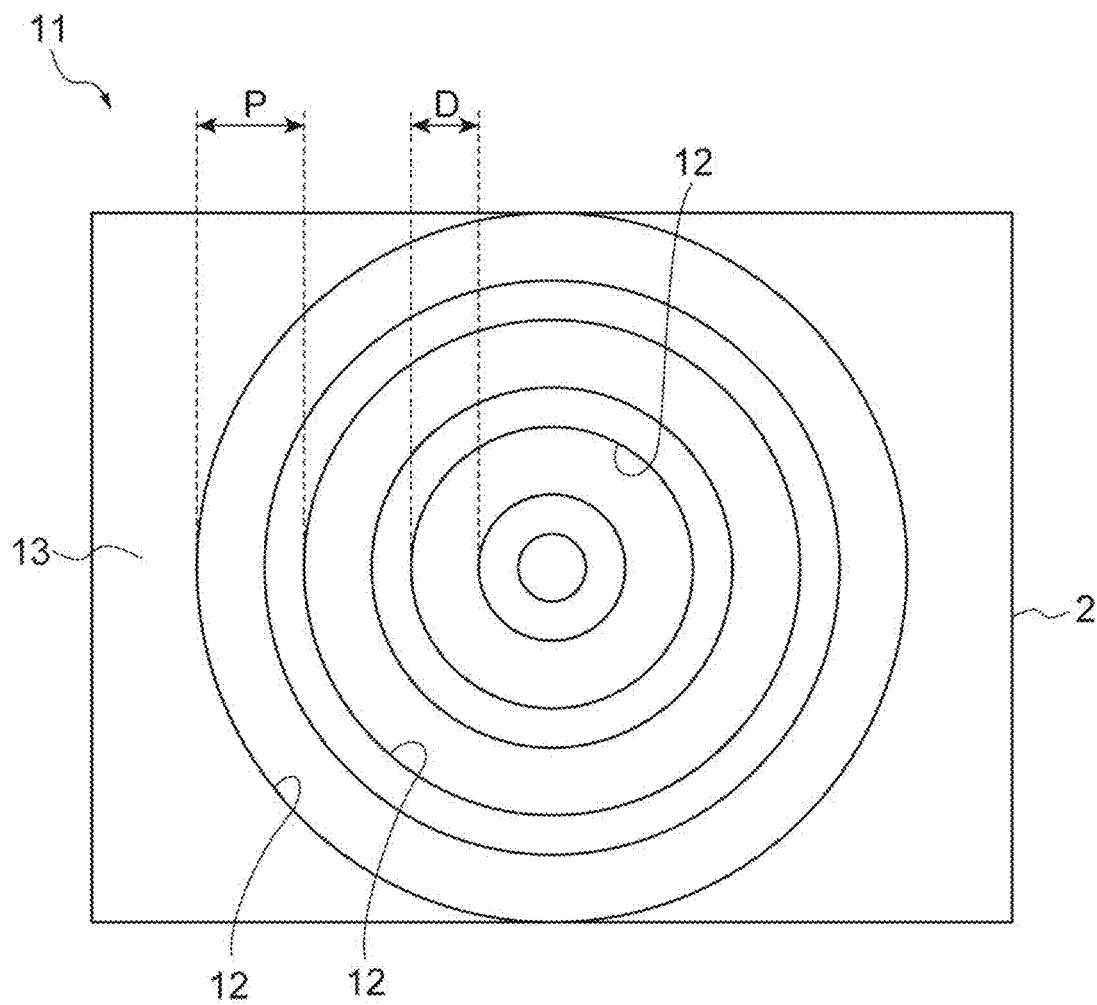
FIG. 10 is a plan view illustrating another modification example of the arrangement pattern of the concave portions in the periodic nano-concave/convex structure.

Further, as illustrated in FIG. 10, the concave portions 12 in the periodic nano-concave/convex structure 11 may have a concentric circular arrangement pattern in a plan view. When a concentric circular arrangement pattern is adopted, the light L in all polarization directions, is uniformly converted to surface plasmons s. Therefore, it is possible to detect light independent of the polarization direction.

Figure 11:
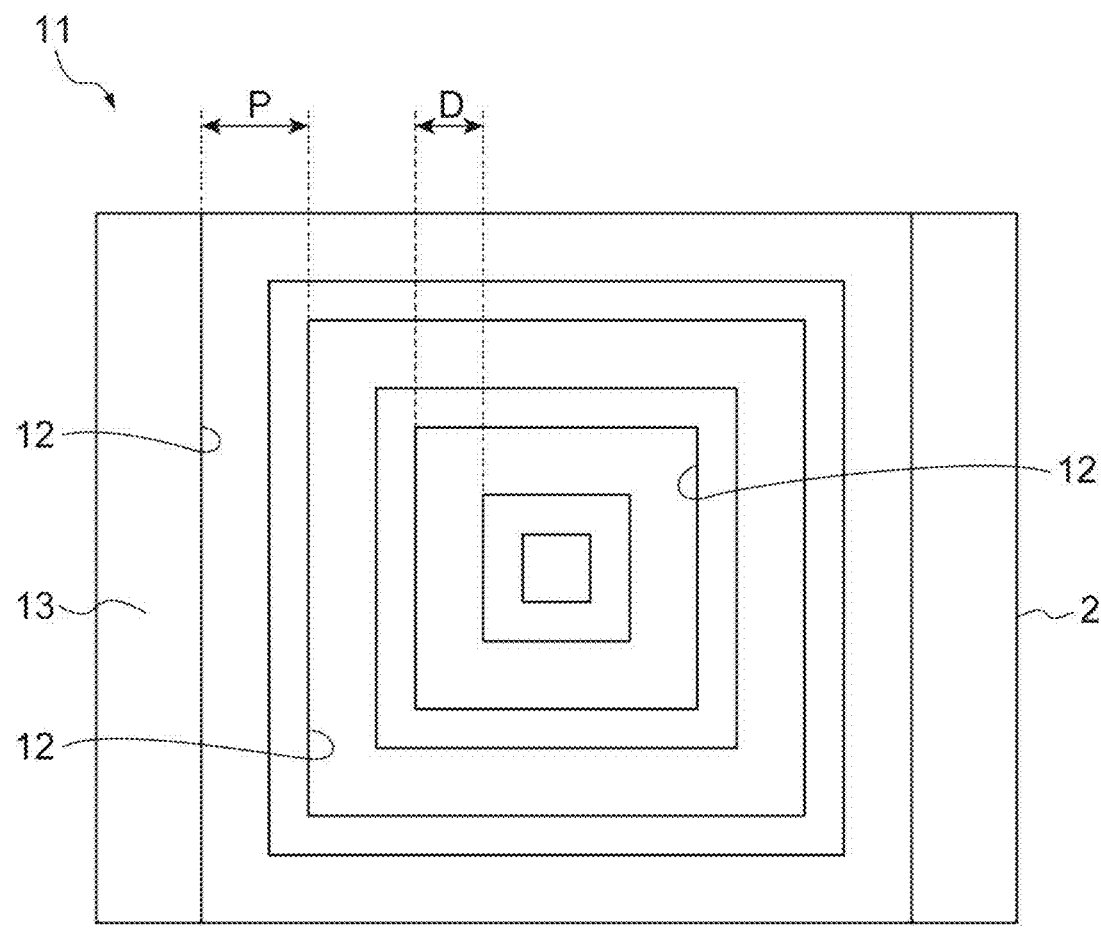
FIG. 11 is a plan view illustrating still another modification example of the arrangement pattern of the concave portions in the periodic nano-concave/convex structure.

Furthermore, as illustrated in FIG. 11, the concave portions 12 in the periodic nano-concave/convex structure 11 may have a concentric polygonal arrangement pattern in a plan view. When a concentric polygonal arrangement pattern is adopted, only the light L of which an electric field vector is orthogonal to each side of the concentric polygonal arrangement pattern is converted into strong surface plasmons in the periodic nano-concave/convex structure 11. Therefore, it is possible to detect light with high sensitivity in two polarization directions. Although a concentric quadrangular shape is shown in FIG. 11, another polygonal shape such as a concentric triangle shape or a concentric hexagonal shape may be used.

DESCRIPTION OF REFERENCE NUMERALS

1 Photodetection element
2 Semiconductor layer
2a Front surface (other surface)
2b Back surface (one surface)
11 Periodic nano-concave/convex structure
12 Concave portion
13 Convex portion
14 Metal film
C1 Longitudinal resonator
C2 Transverse resonator
F Incidence surface
L Light
T Height of convex portion
P Arrangement pitch of convex portion
D Width of concave portion

What is claimed is:

1. A photodetection element having a light incidence surface on one side of a semiconductor layer, the photodetection element comprising:
a periodic nano-concave/convex structure provided on the other surface of the semiconductor layer and having convex portions and concave portions constituting a longitudinal resonator and a transverse resonator for light incident from the light incidence surface, the periodic nano-concave/convex structure converting the light into surface plasmons; and
a metal film provided to cover the periodic nano-concave/convex structure,
wherein a height and an arrangement pitch of the convex portions in the periodic nano-concave/convex structure are set such that a resonance wavelength of the longitudinal resonator and a resonance wavelength of the transverse resonator match,
a thickness of the metal film is equal to or greater than 20 nm,
the metal film is formed of a plurality of films including a first film in contact with the semiconductor layer and a second film with a refractive index smaller than that of the first film and
when a wavelength of the surface plasmons generated in the periodic nano-concave/convex structure is $\lambda$, the height (T) of the convex portion satisfies $3/8\lambda_p<T<5/8\lambda_p$, and the arrangement pitch (P) of the convex portions satisfies $9/10\lambda_p<P<11/10\lambda_p$.

2. The photodetection element according to claim 1, wherein when the wavelength of the surface plasmons generated in the periodic nano-concave/convex structure is $\lambda_p$, a width (D) of the concave portion satisfies 50 nm$<D<\lambda_p-$50 nm.

3. The photodetection element according to claim 1, wherein the semiconductor layer is formed of silicon.

4. The photodetection element according to claim 1, wherein the metal film includes aluminum.

5. The photodetection element according to claim 1, wherein the concave portion in the periodic nano-concave/convex structure has an arrangement pattern in a matrix form in a plan view.

6. The photodetection element according to claim 5, wherein a transverse sectional shape of the concave portion is a circular or rectangular shape.

7. The photodetection element according to claim 1, wherein the concave portion in the periodic nano-concave/convex structure has a stripe-shaped arrangement pattern in a plan view.

8. The photodetection element according to claim 1, wherein the concave portion in the periodic nano-concave/convex structure has a concentric circular arrangement pattern in a plan view.

9. The photodetection element according to claim 1, wherein the concave portion in the periodic nano-concave/convex structure has a concentric polygonal arrangement pattern in a plan view.

10. A photodetection element having a light incidence surface on one side of a semiconductor layer, the photodetection element comprising:
a periodic nano-concave/convex structure provided on the other surface of the semiconductor layer and having convex portions and concave portions constituting a longitudinal resonator and a transverse resonator for light incident from the light incidence surface, the periodic nano-concave/convex structure converting the light into surface plasmons; and
a metal film provided to cover the periodic nano-concave/convex structure,
wherein a height and an arrangement pitch of the convex portions in the periodic nano-concave/convex structure are set such that a resonance wavelength of the longitudinal resonator and a resonance wavelength of the transverse resonator match,
a thickness of the metal film is equal to or greater than 20 nm,
the metal film is formed of a plurality of films including a first film in contact with the semiconductor layer and a second film with a refractive index smaller than that of the first film, and
when a wavelength of the surface plasmons generated in the periodic nano-concave/convex structure is $\lambda_p$, a width (D) of the concave portion satisfies 50 nm<D<$\lambda_p$−50 nm.

11. The photodetection element according to claim 10, wherein when the wavelength of the surface plasmons generated in the periodic nano-concave/convex structure is $\lambda_p$, the height (T) of the convex portion satisfies $3/8\lambda_p$<T<$5/8\lambda_p$, and the arrangement pitch (P) of the convex portions satisfies $9/10\lambda_p$<P<$11/10\lambda_p$.

12. The photodetection element according to claim 10, wherein the semiconductor layer is formed of silicon.

13. The photodetection element according to claim 10, wherein the metal film includes aluminum.

14. The photodetection element according to claim 10, wherein the concave portion in the periodic nano-concave/convex structure has an arrangement pattern in a matrix form in a plan view.

15. The photodetection element according to claim 14, wherein a transverse sectional shape of the concave portion is a circular or rectangular shape.

16. The photodetection element according to claim 10, wherein the concave portion in the periodic nano-concave/convex structure has a stripe-shaped arrangement pattern in a plan view.

17. The photodetection element according to claim 10, wherein the concave portion in the periodic nano-concave/convex structure has a concentric circular arrangement pattern in a plan view.

18. The photodetection element according to claim 10, wherein the concave portion in the periodic nano-concave/convex structure has a concentric polygonal arrangement pattern in a plan view.

* * * * *